United States Patent
Nagao et al.

(10) Patent No.: US 11,210,032 B1
(45) Date of Patent: Dec. 28, 2021

(54) STORAGE DEVICE AND DATA PROCESSING METHOD

(71) Applicant: Hitachi, Ltd., Tokyo (JP)

(72) Inventors: Takashi Nagao, Tokyo (JP); Tomohiro Yoshihara, Tokyo (JP); Akira Yamamoto, Tokyo (JP); Yuusaku Kiyota, Tokyo (JP)

(73) Assignee: HITACHI, LTD., Tokyo (JP)

( * ) Notice: Subject to any disclaimer, the term of this patent is extended or adjusted under 35 U.S.C. 154(b) by 0 days.

(21) Appl. No.: 17/190,152

(22) Filed: Mar. 2, 2021

(30) Foreign Application Priority Data

Sep. 17, 2020 (JP) .............................. JP2020-156106

(51) Int. Cl.
*G06F 3/06* (2006.01)
*H03M 7/30* (2006.01)

(52) U.S. Cl.
CPC .......... *G06F 3/0661* (2013.01); *G06F 3/0608* (2013.01); *G06F 3/0641* (2013.01); *G06F 3/0673* (2013.01); *H03M 7/6011* (2013.01)

(58) Field of Classification Search
CPC .... G06F 3/0661; G06F 3/0608; G06F 3/0641; G06F 3/0679
See application file for complete search history.

(56) References Cited

U.S. PATENT DOCUMENTS 10,635,315 B1 * 4/2020 Armangau .............. G06F 3/067
2017/0147624 A1 5/2017 Burger et al.

OTHER PUBLICATIONS

Intel® QuickAssist Technology API Programmer's Guide May 2020 (Year: 2020).*

* cited by examiner

*Primary Examiner* — William E. Baughman
*Assistant Examiner* — Janice M. Girouard
(74) *Attorney, Agent, or Firm* — Mattingly & Malur, PC

(57) ABSTRACT

The present invention realizes a storage device that has a high data reduction effect without decreasing I/O performances. The storage device includes a processor, an accelerator, a memory, and a storage medium, the processor specifies data to be compressed that is data stored in the storage medium from data stored in the memory and transmits a compression instruction including information relating to the data to be compressed to the accelerator, and the accelerator reads the plurality of continuous items of data from the memory and compresses the plurality of items of data to be compressed obtained by excluding data that is not to be compressed from the plurality of items of data, based on the information relating to the data to be compressed received from the processor, to generate compressed data stored in the storage device.

14 Claims, 10 Drawing Sheets

[FIG. 1]
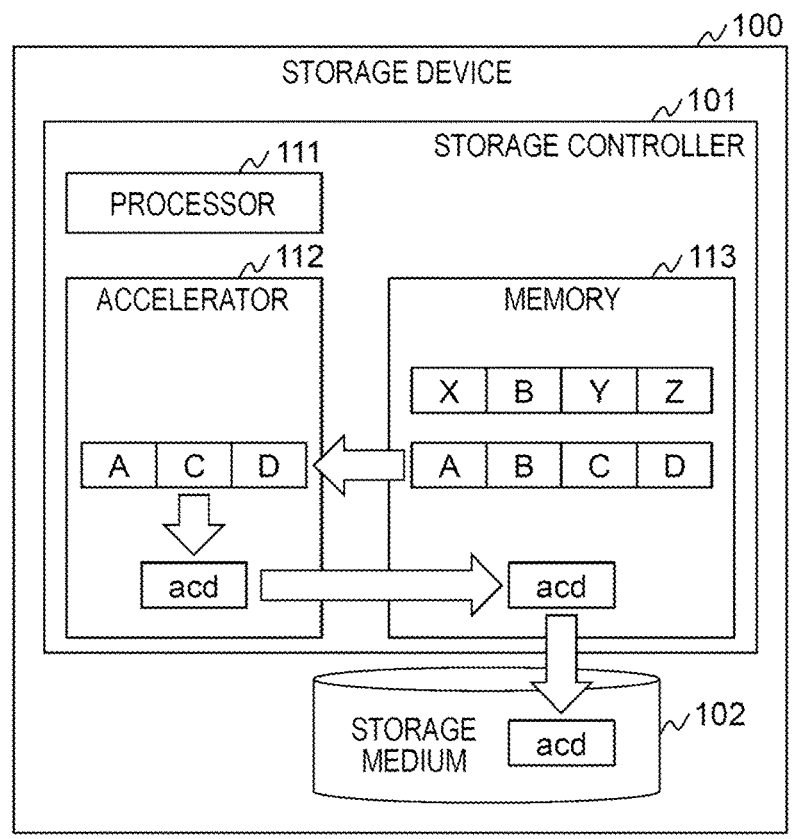
[FIG. 2]
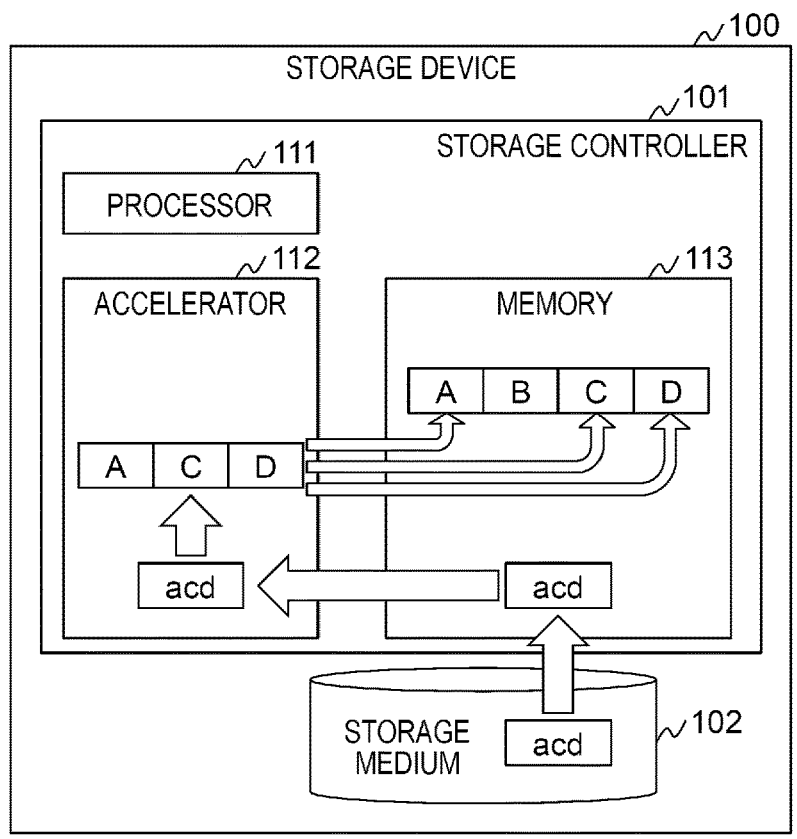

[FIG. 3]
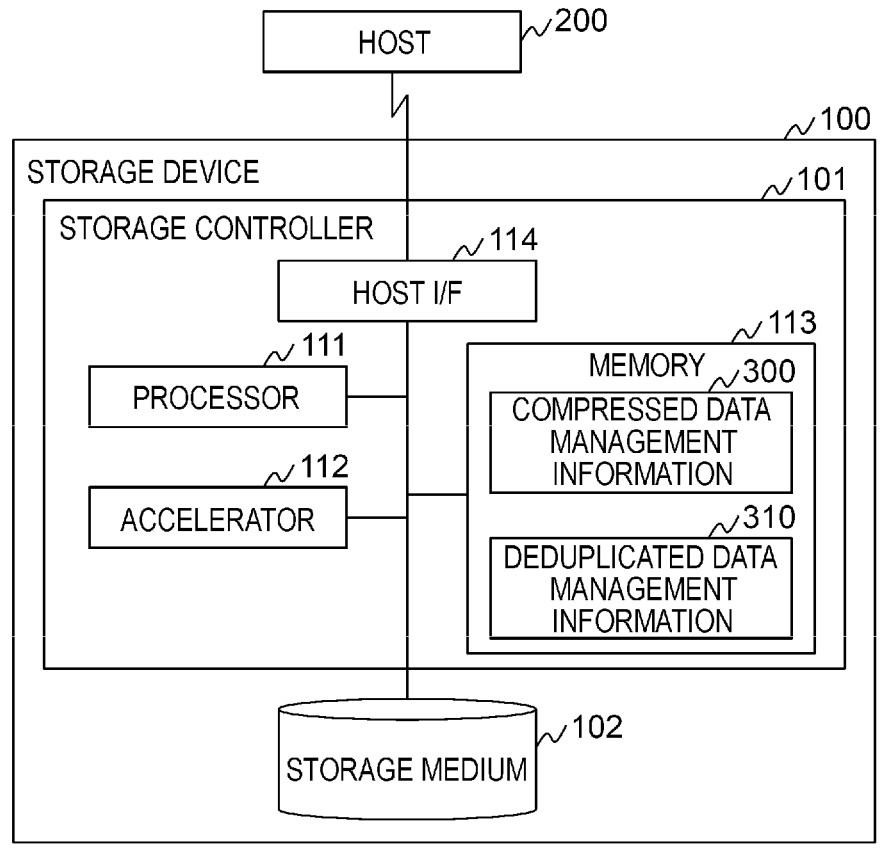
[FIG. 4]
| LOGICAL ADDRESS | PHYSICAL ADDRESS | DATA SIZE |
|---|---|---|
| 0xA000 | 0x3000 | 10 |
| 0xB000 | 0x2000 | 4 |
| 0xC000 | 0x1000 | 8 |
[FIG. 5]
| LOGICAL ADDRESS | REFERENCE LOGICAL ADDRESS |
|---|---|
| 0xB002 | 0xA000 |
| 0xB003 | 0xB000 |
| 0xC001 | 0xA001 |

[FIG. 6]
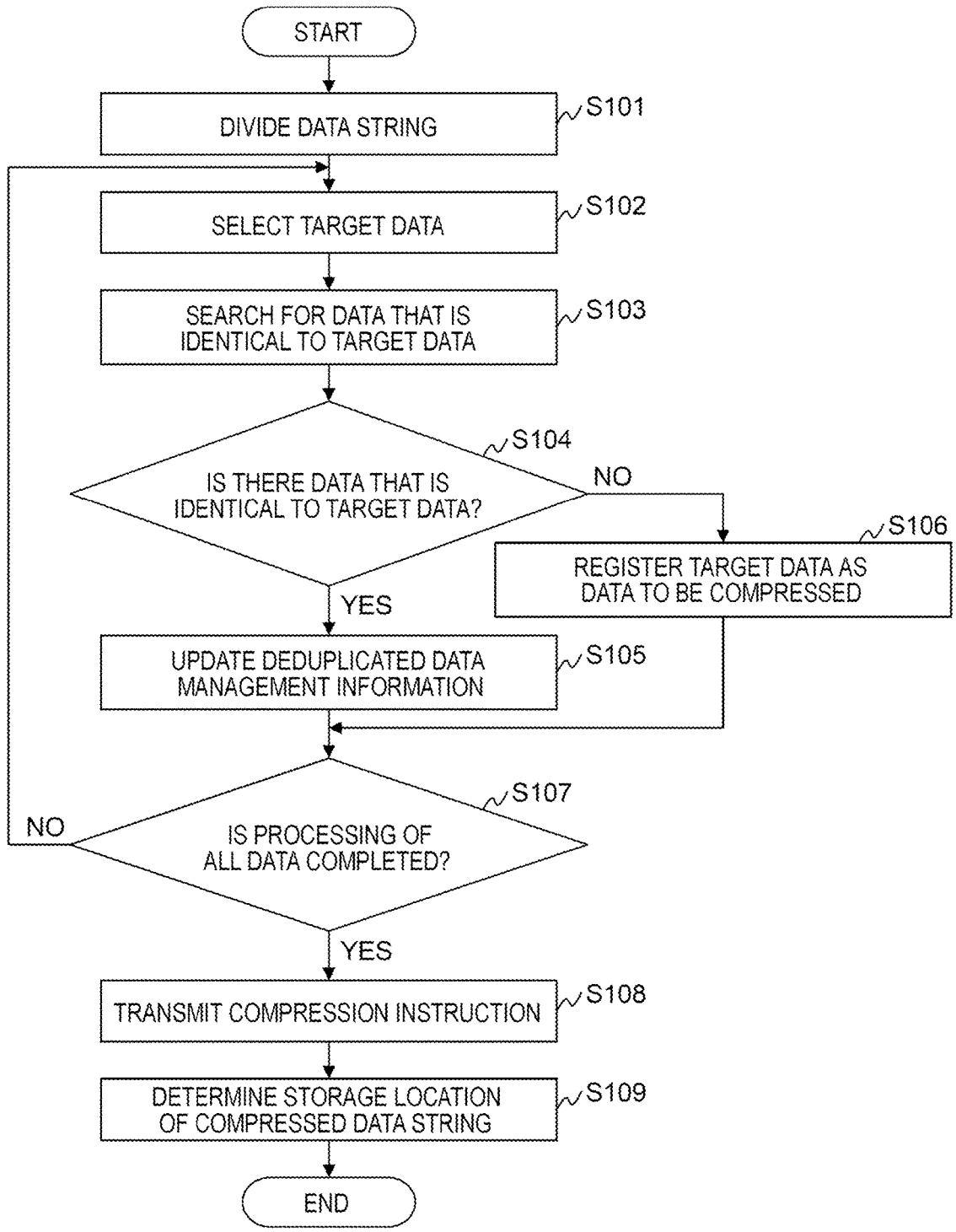

[FIG. 7]
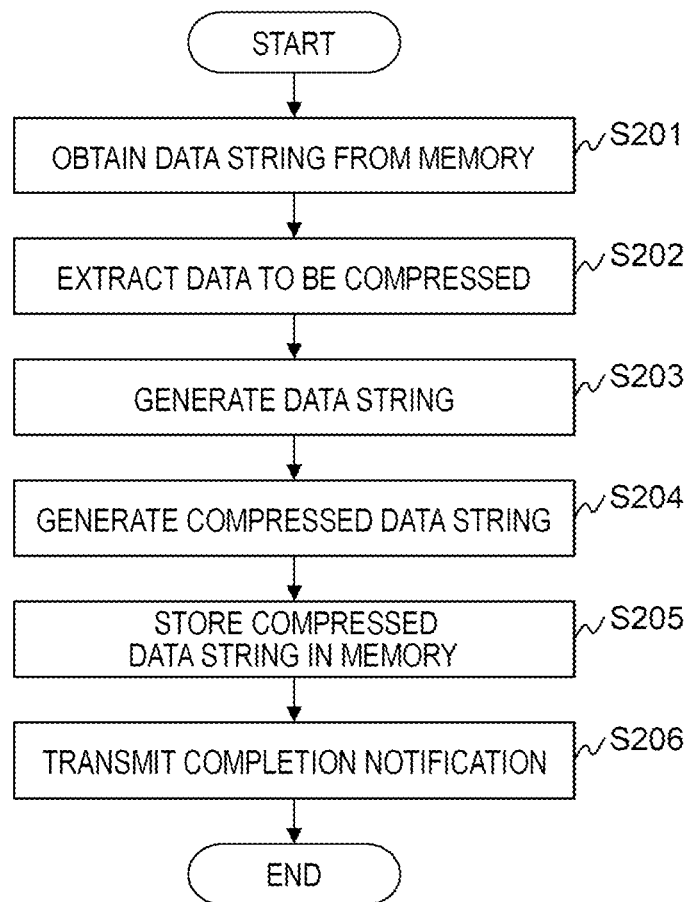

[FIG. 8]
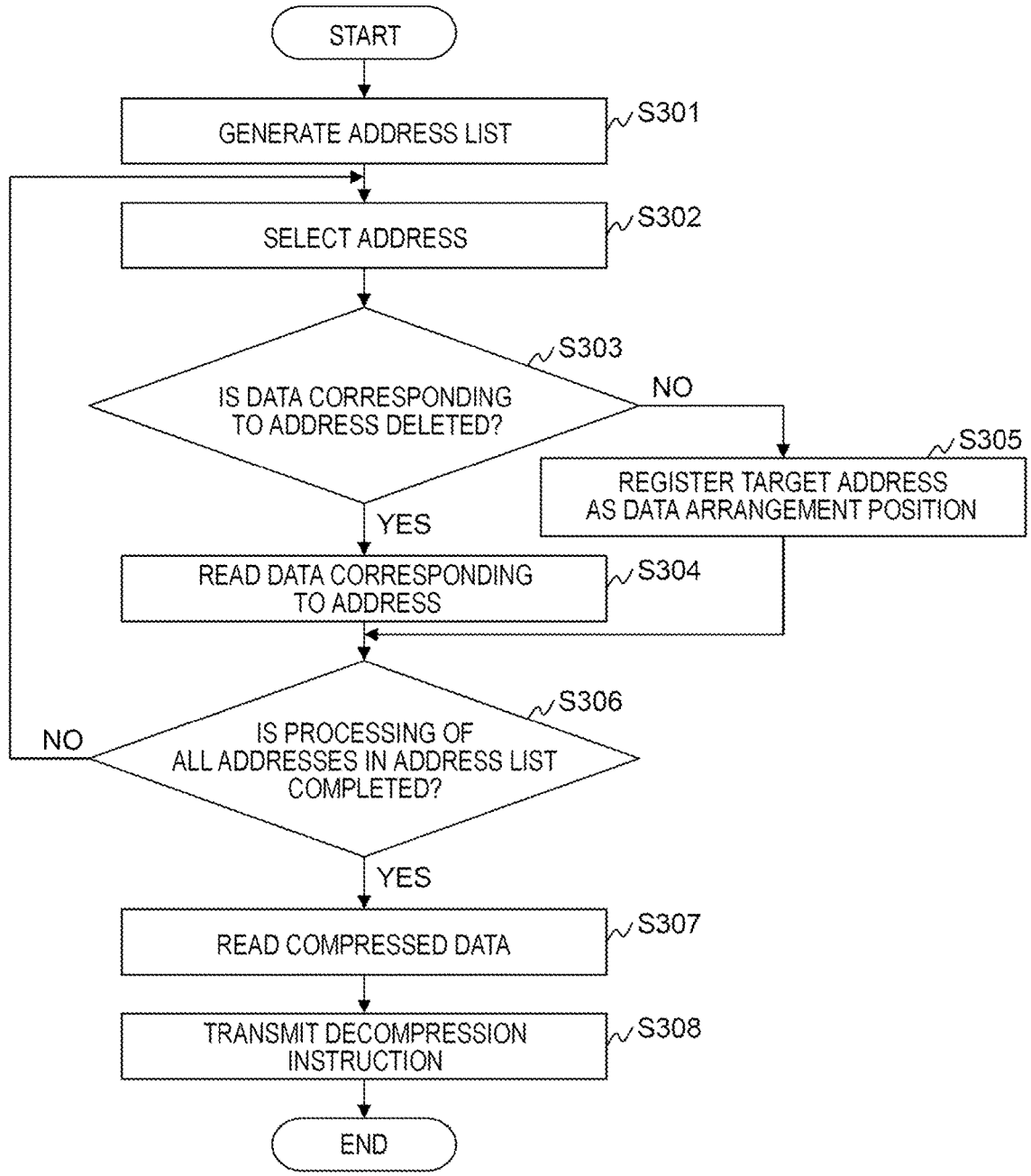

[FIG. 9]
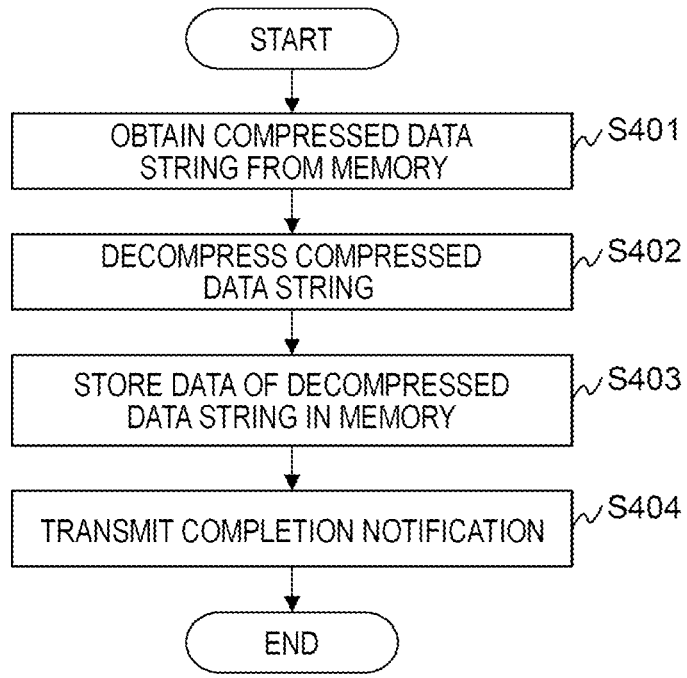
[FIG. 10]
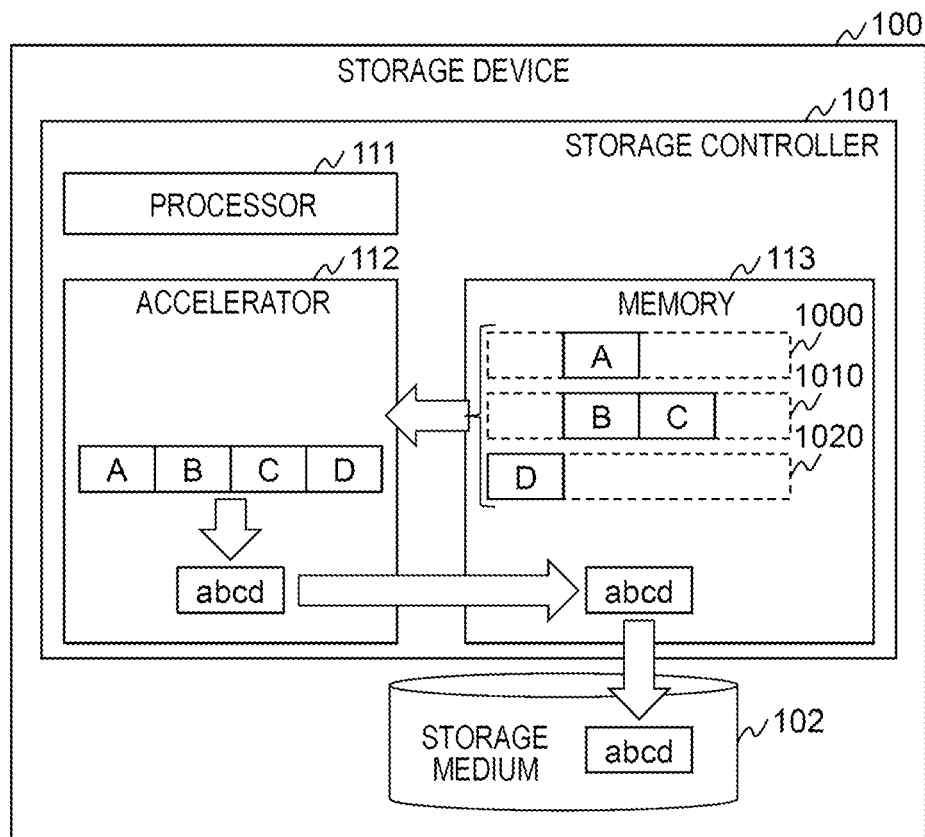

[FIG. 11]
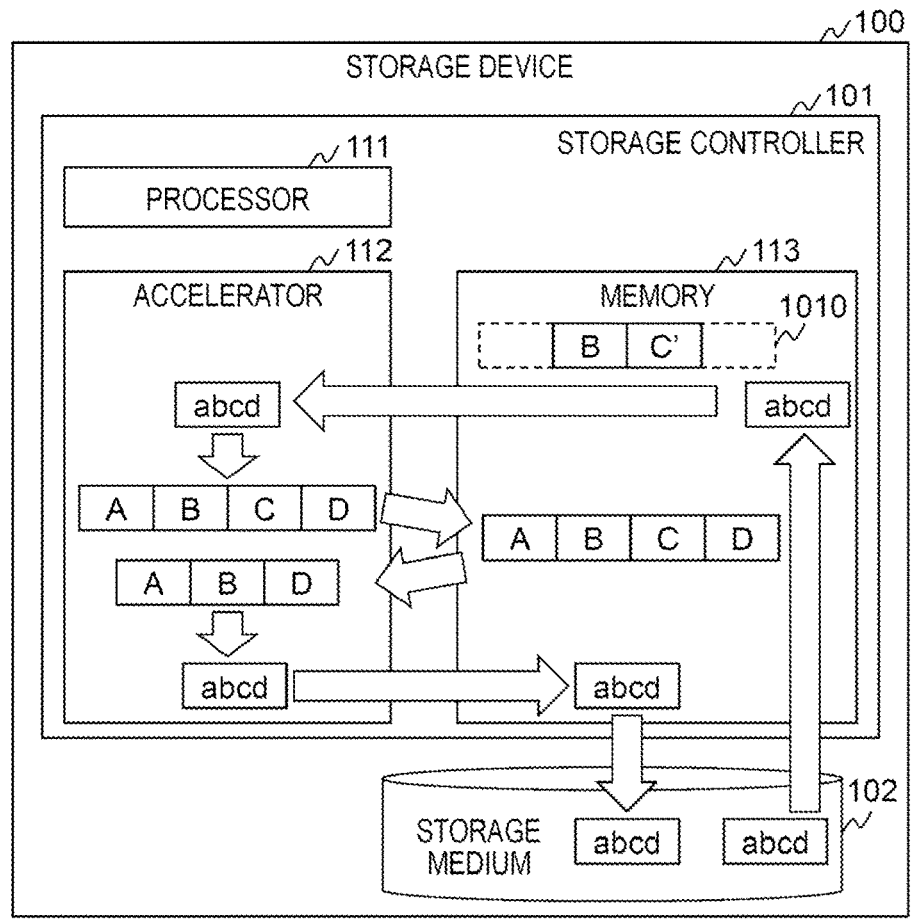
[FIG. 12]
| BLOCK NUMBER | PHYSICAL ADDRESS | DATA SIZE |
|---|---|---|
| 1 | 0x3000 | 10 |
| 2 | 0x2000 | 4 |
| 3 | 0x1000 | 8 |
[FIG. 13]
| LOGICAL ADDRESS | BLOCK NUMBER | OFFSET |
|---|---|---|
| 0xA000 | 1 | 1 |
| 0xA001 | 3 | 2 |
| 0xA002 | 3 | 3 |

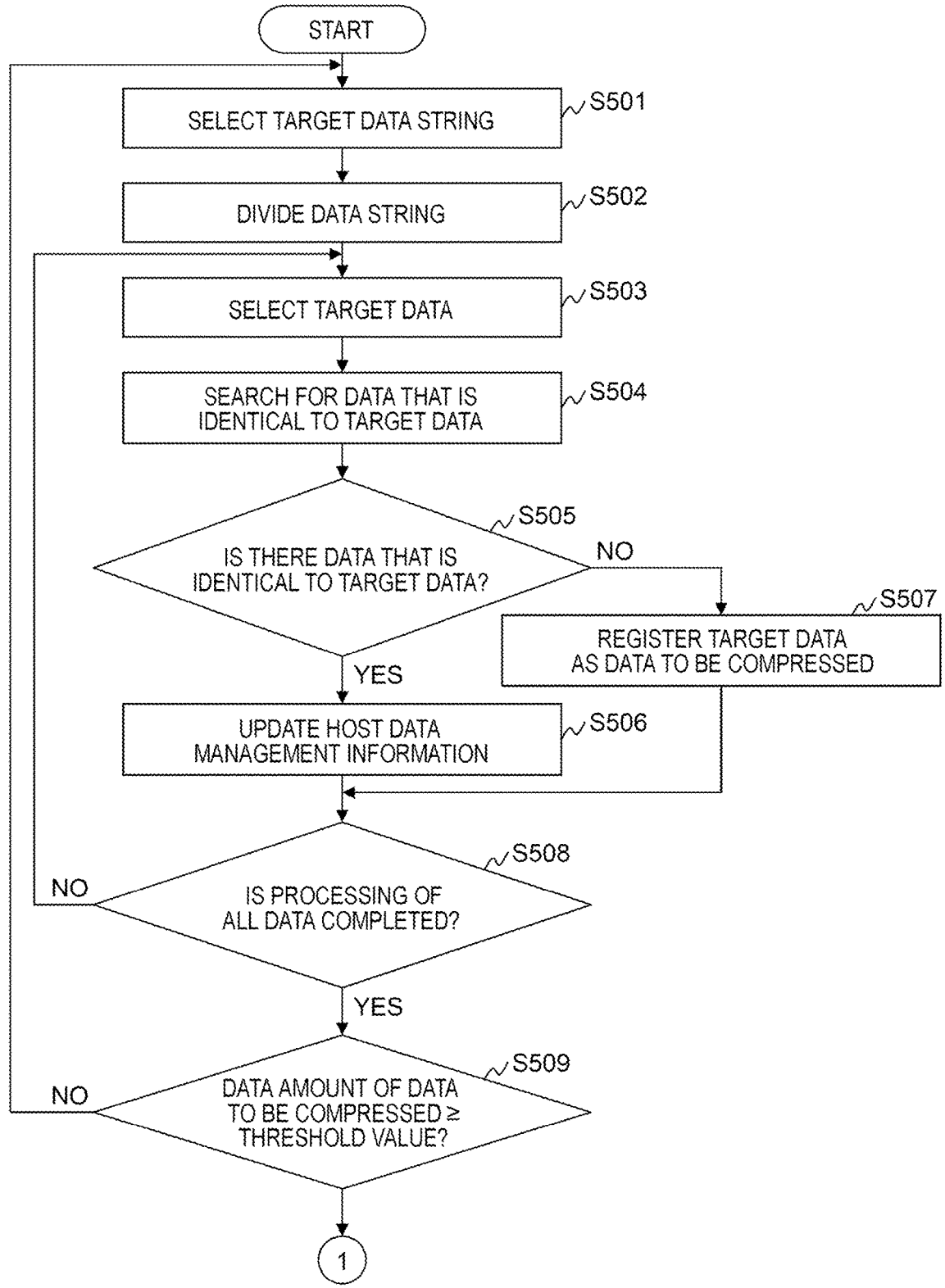
[FIG. 14A]

[FIG. 14B]
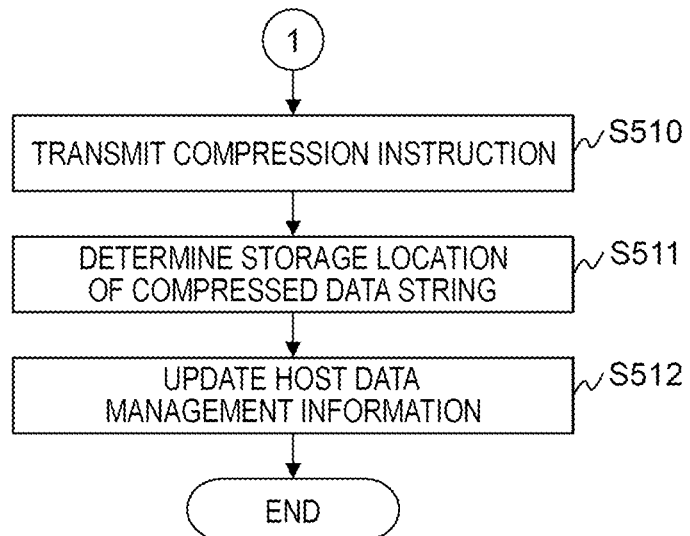
[FIG. 15]
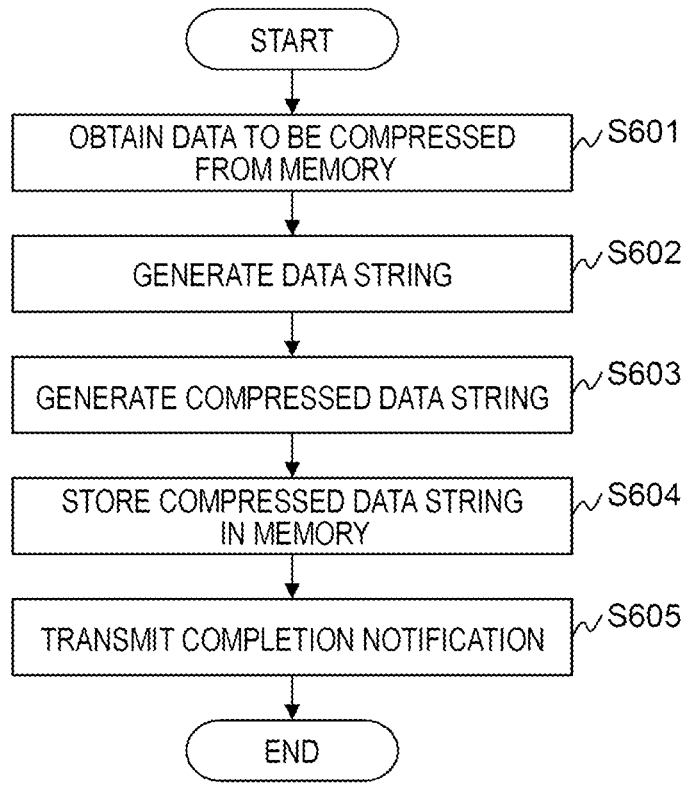

[FIG. 16]
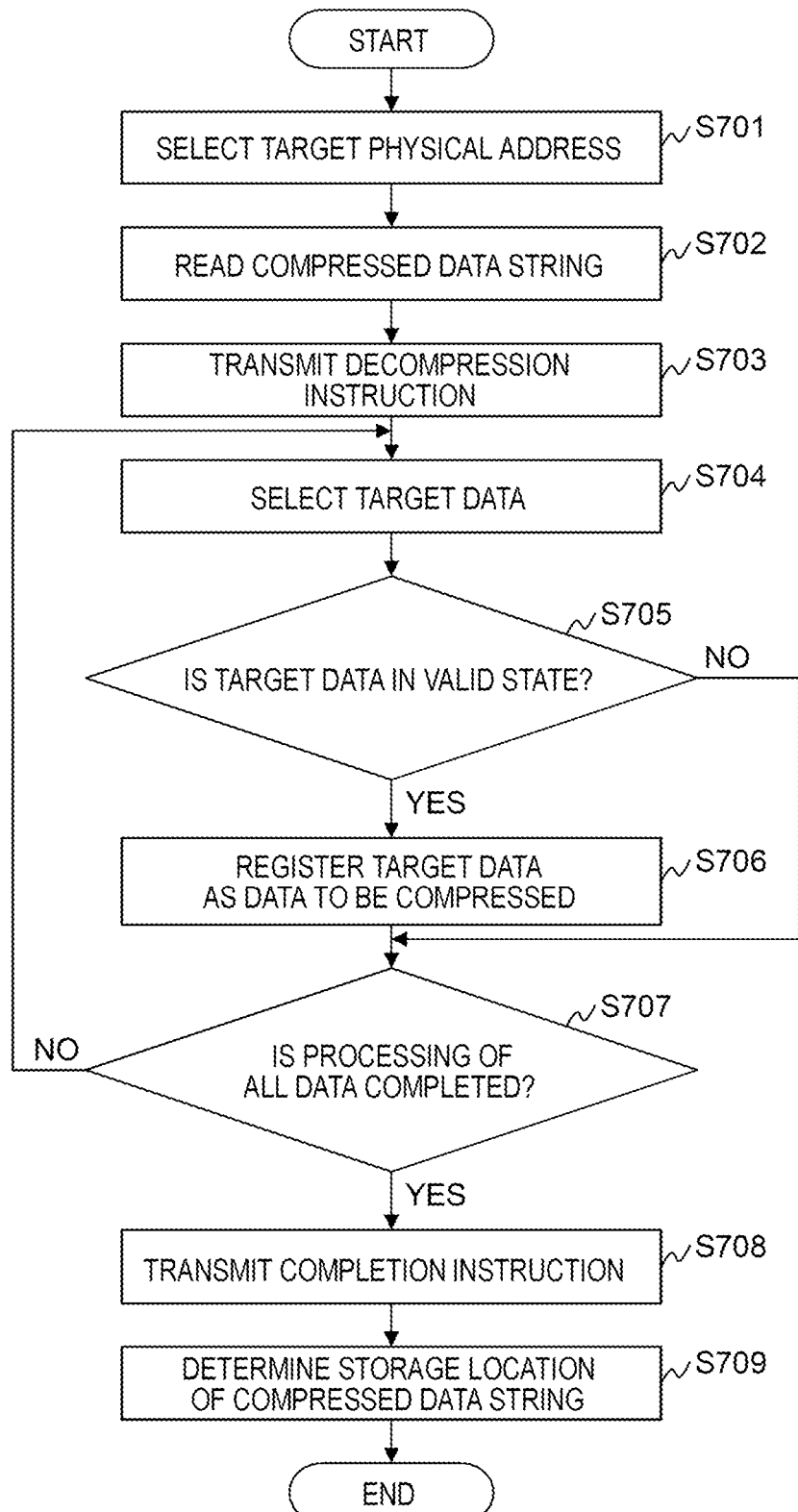

STORAGE DEVICE AND DATA PROCESSING METHOD

CLAIM OF PRIORITY

The present application claims priority from Japanese patent application JP 2020-156106 filed on Sep. 17, 2020, the content of which is hereby incorporated by reference into this application.

TECHNICAL FIELD

The present invention relates to a storage device having a capacity reduction function.

BACKGROUND ART

In recent years, as represented by Internet of Things (IoT) and Artificial Intelligence (AI), technologies that create a new value by analyzing a huge amount of data are widespread.

A storage device that stores a huge amount of data requires a low data storage cost (price per capacity) and high Input/Output (I/O) performances.

The data storage cost is calculated by a product of the bit cost (price per capacity) and the amount of data to be stored. As a technology that realizes the reduction of the data storage cost by reducing the amount of data to be stored, deduplication and compression are provided. The deduplication is a function that performs control to search for the same data in a storage device, delete one item of data, and refer to the other item of data. The compression is a function that replaces a bit string with a shorter bit string by encoding the bit string of data.

In recent years, a storage device with a low data storage cost by combining the deduplication and the compression is widespread.

However, encoding of a bit string is a process with a large calculation load, and thus causes a decrease in I/O performances in a storage device that handles a huge amount of data.

As a countermeasure for the decrease in the I/O performances, for example, the technique disclosed in US-A-2017/0147624 (PTL 1) is known. PTL 1 discloses a system that reduces a load on the CPU by mounting an accelerator on a CPU bus which can perform data compression and decompression at high speed with dedicated hardware and offloading the compression and decompression of data that is maintained in the memory and data that is input and output on the bus.

CITATION LIST

Patent Literature

PTL 1: US-A-2017/0147624

SUMMARY OF INVENTION

Technical Problem

The data reduction effect of deduplication and compression varies depending on the size of a processing unit.

In deduplication, the smaller the processing unit, the higher the data reduction effect. This is because if the processing unit is small, it is more likely that the same data exists in the storage device. For example, when there is data of ABCD and DCBA, if the processing unit is 4 characters, the two items of data are treated as different data and are not deduplicated. Meanwhile, if the processing unit is one character, each part of A, B, C, and D is treated as the same data and can be deduplicated.

Meanwhile, in compression, the larger the processing unit, the higher the data reduction effect. For example, a situation where there are eight items of 8 kB data is assumed, compared with a case where each data is individually compressed, in a case where 64 kB data obtained by combining the eight items of data into one is compressed, the data reduction rate is higher. This is because a lossless compression algorithm used in the storage device is generally a slide dictionary method, and the larger the compression unit, the wider the dictionary search space, so it is more likely that the character strings are identical to each other.

In order to obtain a high data reduction effect, it is required to combine deduplication with a small processing unit and compression with a large processing unit. First, the same data is searched for with a small processing unit in the data string and deduplicated. Next, the data string excluding the data deleted by deduplication is compressed. Here, it is concerned that, an operation of the data string by the processor is required in order to remove the data deleted by deduplication, thus I/O performances decrease.

Solution to Problem

A typical example of the invention disclosed in the present application is as follows. That is, the storage device includes a processor, an accelerator, a memory, and a storage medium, the processor specifies data to be compressed that is data stored in the storage medium from data stored in the memory and transmits a compression instruction including information relating to the data to be compressed to the accelerator, and the accelerator reads the plurality of continuous items of data from the memory and compresses the plurality of items of data to be compressed obtained by excluding data that is not to be compressed from the plurality of items of data, based on the information relating to the data to be compressed received from the processor, to generate compressed data stored in the storage medium.

Advantageous Effects of Invention

According to the present invention, it is possible to realize a storage device that has a high data reduction effect without decreasing I/O performances. Issues, configurations and effects other than those described above are clarified by the description of the following embodiments.

BRIEF DESCRIPTION OF DRAWINGS

FIG. 1 is a diagram illustrating an overview of processing executed by a storage device of Embodiment 1.

FIG. 2 is a diagram illustrating an overview of processing executed by the storage device of Embodiment 1.

FIG. 3 is a diagram illustrating an example of a configuration of the storage device of Embodiment 1.

FIG. 4 is a diagram illustrating an example of a configuration of compressed data management information of Embodiment 1.

FIG. 5 is a diagram illustrating an example of a configuration of deduplicated data management information of Embodiment 1.

FIG. 6 is a flowchart illustrating an example of a data reduction process executed by a processor of Embodiment 1.

FIG. 7 is a flowchart illustrating an example of a compression process executed by an accelerator of Embodiment 1.

FIG. 8 is a flowchart illustrating an example of a data string reading process executed by the processor of Embodiment 1.

FIG. 9 is a flowchart illustrating an example of a decompression process executed by the accelerator of Embodiment 1.

FIG. 10 is a diagram illustrating an overview of processing executed by a storage device of Embodiment 2.

FIG. 11 is a diagram illustrating an overview of processing executed by the storage device of Embodiment 2.

FIG. 12 is a diagram illustrating an example of compressed data management information of Embodiment 2.

FIG. 13 is a diagram illustrating an example of host data management information of Embodiment 2.

FIG. 14A is a flowchart illustrating an example of a data reduction process executed by the processor of Embodiment 2.

FIG. 14B is a flowchart illustrating an example of the data reduction process executed by the processor of Embodiment 2.

FIG. 15 is a flowchart illustrating an example of a compression process executed by an accelerator of Embodiment 2.

FIG. 16 is a flowchart illustrating an example of garbage collection executed by the processor of Embodiment 2.

DESCRIPTION OF EMBODIMENTS

Hereinafter, embodiments of the present invention are described with reference to diagrams. However, the present invention is not construed as being limited to the contents of the examples shown below. It is easily understood by those skilled in the art that a specific configuration thereof can be changed without departing from the idea or gist of the present invention.

In the configurations of the invention described below, the same or similar configurations or functions are denoted by the same reference numerals, and duplicate description is omitted.

The notations such as "first", "second", and "third" in the present specification and the like are attached to identify components, and do not necessarily limit the number or order.

Embodiment 1

First, an overview of processing executed by a storage device 100 of Embodiment 1 is described with reference to FIGS. 1 and 2. FIGS. 1 and 2 are diagrams illustrating the overview of the processing executed by the storage device 100 of Embodiment 1.

The storage device 100 is a device providing a storage area to a host 200 (see FIG. 3), and includes a storage controller 101 including a processor 111, an accelerator 112, and a memory 113, and a storage medium 102. The host 200 recognizes a provided storage area as a logical volume, and executes data reading and data writing by using the corresponding volume.

An overview of a writing process executed by the storage device 100 of Embodiment 1 by using FIG. 1 is described. Here, processing when the host 200 writes a data string configured with a plurality of items of data arranged in an address (logical address) order to a volume is described.

First, a data string written by the host 200 is stored in the memory 113. In FIG. 1, after a data string XBYZ is written, a data string ABCD is written.

The data string XBYZ is a data string configured with data X, B, Y, and Z, and the data string ABCD is a data string configured with data A, B, C, and D. Each item of data of the data string is arranged in a logical address order.

After the data string ABCD is stored in the memory 113, the processor 111 compares the data string XBYZ and the data string ABCD stored in the memory 113 in a predetermined processing unit. The processing unit compares data in a minimum data size of a data string, that is, in a unit of data X and A. As a result of the above comparison, since the data B of the data string ABCD is identical to the data B of the other data string XBYZ, the processor 111 determines that the data B is data that does not need to be stored in the storage medium 102. The processor 111 generates information indicating that the data A, C, and D is data to be compressed.

The processor 111 instructs the accelerator 112 to compress the data together with an address of the data string ABCD on the memory 113 and the information relating to the data to be compressed. Here, the information relating to the data to be compressed is, for example, a list of bitmaps and address ranges. The bitmap has bit strings in the same number as the number of items of data that configure the data string, and 1 is stored for a bit corresponding to the data to be compressed.

The accelerator 112 obtains the data string ABCD from the memory 113 based on the address of the data string ABCD. The accelerator 112 obtains the data A, C, and D from the data string ABCD based on the information relating to the data to be compressed, arranges the obtained data A, C, and D in an address order to generate a data string ACD, and compresses the data string ACD based on a compression algorithm to generate compressed data acd. The accelerator 112 stores the compressed data acd in the memory 113. Thereafter, the processor 111 stores the compressed data acd on the memory 113, in the storage medium 102.

In deduplication, the processor 111 searches for duplicate data in a small processing unit. According to this, since it is possible to effectively search for and delete duplicated data, a data reduction effect can be enhanced. In compression, the accelerator 112 compresses data (data string) in a data string generated by arranging the data to be compressed, that is, in a processing unit larger than that in the deduplication. Accordingly, it is possible to generate compressed data with a high compression rate, and thus the data reduction effect can be enhanced.

The above is the overview of the writing process.

Hereinafter, an overview of a reading process executed by the storage device 100 of Embodiment 1 with reference to FIG. 2 is described. Here, processing when the host 200 transmits a read request of the data string ABCD to the storage device 100 is described. A logical address of the data string ABCD in the volume is included in the read request.

The processor 111 reads the data B deleted in the deduplication process from the storage medium 102 and stores the data in the memory 113. The processor 111 reads the compressed data acd from the storage medium 102 and stores the data in the memory 113. The processor 111 instructs the accelerator 112 to decompress the data together with the address of the compressed data acd on the memory 113, a storage position (address) of the data string ABCD on the memory 113, and information relating to the arrangement of the decompressed data A, C, and D. Here, the information relating to the arrangement of the decompressed data is, for example, a list or the like of bitmaps and address. The bitmap has bit strings in the same number as the number of items of data that configure the data string, and 1 is stored for a bit corresponding to the data to be compressed.

The accelerator 112 obtains the compressed data acd from the memory 113 based on the address of the compressed data acd and decompresses the compressed data acd to generate the data string ACD. The accelerator 112 stores the data A, C, and D of the data string ACD in a predetermined address of the memory 113 based on the information relating to the arrangement of the decompressed data.

For example, if the information relating to the arrangement of the decompressed data is a bitmap, the accelerator 112 stores data at a position of a data string corresponding to the bit where 1 is stored according to the order of the data in the data string ACD. That is, the accelerator 112 stores the data A at a first position of the arrangement location on the memory 113 of the data string ABCD, stores the data C at the third position, and stores the data D at the fourth position.

Though the data A, C, and D is stored in the memory 113 after the data B is stored in the memory 113, the storage order of the data in the memory 113 may vary.

The above is the overview of the reading process.

Subsequently, details of the storage device 100 of Embodiment 1 are described.

FIG. 3 is a diagram indicating an example of the configuration of the storage device 100 of Embodiment 1.

The storage device 100 is connected to the host 200 that provides a storage area, via a network such as the Storage Area Network (SAN) and the Local Area Network (LAN). The host 200 is, for example, a personal computer or a smart phone.

The storage device 100 includes the storage controller 101 and the storage medium 102.

The storage controller 101 executes processing according to a command. The storage controller 101 includes the processor 111, the accelerator 112, the memory 113, and a host interface 114. Each item of the hardware is connected to each other via an internal network.

The host interface 114 is an interface for connection with the host 200. The host interface 114 executes transmission and reception processes of commands and data between the storage device 100 and the host 200.

The processor 111 executes a program stored in the memory 113. The processor 111 of Embodiment 1 functions as a calculation unit or a control unit that executes various kinds of processing according to the command.

The accelerator 112 is a characteristic element of the present invention and executes a compression process and a decompression process according to the instruction of the processor 111. The accelerator 112 is hardware designed to execute the compression process and the decompression process at high speed, and is installed by using, for example, the field programmable gate array (FPGA).

The memory 113 is a storage device such as a Dynamic Random Access Memory (DRAM) and stores a program executed by the processor 111 and information used by the program. The memory 113 is used as a work area used by the program. The memory 113 may be any one of volatile memories and nonvolatile memories.

The memory 113 of the present embodiment stores compressed data management information 300 and deduplicated data management information 310. The memory 113 stores a program (not illustrated) that realizes a calculation unit or a control unit. Details of the compressed data management information 300 and the deduplicated data management information 310 are described by using FIGS. 4 and 5.

The storage medium 102 is a nonvolatile storage device. The storage medium 102 is, for example, a semiconductor memory such as a hard disk drive (HDD) or a Solid State Drive (SSD). The storage medium 102 is connected to the storage controller 101 via the internal network and executes transmission and reception processes of a command with the processor 111 and transmission and reception processes of data with the memory 113. The storage medium 102 is directly connected to the storage controller 101 via the internal network, but may be connected to the storage controller 101 via the interface for the storage medium connected to the internal network.

FIG. 4 is a diagram indicating an example of the compressed data management information 300 of Embodiment 1.

The compressed data management information 300 is information for managing compressed data. The compressed data management information 300 stores an entry configured with a logical address 301, a physical address 302, and a data size 303. One entry corresponds to one item of compressed data.

The logical address 301 is a field for storing a logical address that indicates a storage location of the data string in the volume provided for the host 200.

The physical address 302 is a field for storing an address that indicates a storage location of the compressed data in the storage device 100. Here, the compressed data is data generated by compressing the data string to which the deduplication process is executed.

The data size 303 is a field for storing the data size of the compressed data.

The data size of the compressed data depends on the original size of the data string, the stored value, and the like. Accordingly, each size of the compressed data is generally different. In order to enhance the data reduction effect, the compressed data is stored in the storage medium 102 without a gap. Then, the processor 111 controls the arrangement of the compressed data on the storage medium 102 by using the compressed data management information 300.

Instead of the physical address of the storage medium 102, an address provided by the storage medium 102 for the storage controller 101, an address of a Redundant Arrays of Inexpensive Disks (RAID) volume generated by using the plurality of storage media 102, and an address of the external storage device 100 provided by a capacity virtualization mechanism may be used.

FIG. 5 is a diagram indicating an example of the deduplicated data management information 310 of Embodiment 1.

The deduplicated data management information 310 is information for managing the data deleted from the data string by deduplication. The deduplicated data management information 310 stores an entry configured with a logical address 311 and a reference logical address 312. One entry corresponds to one item of data deleted by deduplication.

The logical address 311 is a field for storing an address indicating a storage location of the data deleted from the data string by deduplication, in the volume.

The reference logical address 312 is a field for storing an address that indicates the storage location of the data identical to the deleted data, in the volume.

The deduplication processing unit is smaller than the compressed processing unit and thus the data included in a certain data string may be identical to data included in the other data string.

FIG. 6 is a flowchart illustrating an example of a data reduction process executed by the processor 111 of Embodiment 1.

The processor 111 executes the data reduction process at the time of the execution of the writing process or periodically. The writing process is executed when the storage device 100 receives a data string from the host 200. Here, it is described that the data reduction process is executed at the time of the execution of the writing process. In the writing process, the storage device 100 stores the data string in the memory 113 and transmits completion notification of the writing process to the host 200.

The processor 111 divides the data string based on the deduplication processing unit (Step S101). In this case, the processor 111 initializes the information relating to the data to be compressed. For example, the processor 111 generates bit strings (bitmaps) in the same number as the number of items of the divided data.

Subsequently, the processor 111 selects the target data from the divided data (Step S102).

Subsequently, the processor 111 searches for data identical to the target data (Step S103).

For example, the processor 111 calculates a search keyword of a small size which is called a fingerprint from the target data and compares the fingerprint with a fingerprint of the other data. If there is data of the same fingerprint as the fingerprint of the target data, the processor 111 decompress the searched data and compares the decompressed data with the target data.

The data to be compared is data stored in the memory 113 and the storage medium 102.

Subsequently, the processor 111 determines whether there is data identical to the target data based on the search results (Step S104).

If there is data identical to the target data, the processor 111 registers an entry relating to the target data to the deduplicated data management information 310 (Step S105). Thereafter, the processor 111 proceeds to Step S107.

Specifically, the processor 111 adds an entry to the deduplicated data management information 310, stores a logical address of the target data to the logical address 311 of the added entry, and stores a logical address of the data identical to the target data in the reference logical address 312 of the added entry.

The logical address of the target data can be calculated based on an address of the data string including the target data, an order (offset) from the start of the target data, and the deduplication processing unit.

If there is no data identical to the target data, the processor 111 registers the target data as data to be compressed (Step S106). Thereafter, the processor proceeds to Step S107.

For example, the processor 111 sets 1 for a bit corresponding to the target data of the bitmap.

In Step S107, the processor 111 determines whether processing with respect to all data of the data string is completed (Step S107).

If processing with respect to all data of the data string is not completed, the processor 111 returns to Step S102 and executes the same processing.

If processing with respect to all data of the data string is completed, the processor 111 transmits a compression instruction including a storage position (address) of the data string on the memory 113 and information relating to the data to be compressed to the accelerator 112 (Step S108). The processor 111 transitions to a standby state until receiving a completion notification from the accelerator 112. In the completion notification, the storage location (address) of the compressed data on the memory 113 and the data size of the compressed data are included.

If the completion notification is received from the accelerator 112, the processor 111 determines the storage location of the compressed data in the storage medium 102 (Step S109), and then ends the data reduction process. Specifically, the following processing is executed.

(S109-1) The processor 111 refers to the compressed data management information 300 and searches for an entry where the logical address of the data string is stored in the logical address 301. If there is not the corresponding entry, the processor 111 adds an entry to the compressed data management information 300 and stores the logical address of the data string in the logical address 301 of the added entry.

(S109-2) The processor 111 refers to the physical address 302 of the compressed data management information 300 and specifies a position (address) at the end of the storage area where the compressed data of the storage medium 102 is stored. The processor 111 determines the address of the storage area where the compressed data is stored based on the corresponding address.

(S109-3) The processor 111 stores the determined address in the physical address 302 of the entry where the logical address of the data string is stored in the logical address 301 and stores the notified data size of the compressed data in the data size 303 of the corresponding entry. Accordingly, the compressed data is stored in the storage area of the storage medium 102 from the front.

The above is the description of the processing of Step S109.

If the data reduction process is periodically executed, the processor 111 executes the processing described with reference to FIG. 6 on each data string.

After the data reduction process is executed, the processor 111 stores the compressed data in the determined address of the storage medium 102 at any timing. For example, the data reduction process and the compressed data storage process may be continuously executed, and the compressed data storage process may be periodically executed. If the compressed data storage process is periodically executed, the processor 111 searches for the compressed data stored in the memory 113 and stores the searched compressed data in the storage medium 102.

FIG. 7 is a flowchart illustrating an example of the compression process executed by the accelerator 112 of Embodiment 1.

If the compression instruction is received from the processor 111, the accelerator 112 initiates the compression process.

The accelerator 112 obtains a data string from the storage position (address) of the data string on the memory 113 notified from the processor 111 (Step S201).

The accelerator 112 extracts data to be compressed from the data string based on the information relating to the data to be compressed notified from the processor 111 (Step S202).

For example, if the information relating to the data to be compressed is a bitmap, the accelerator 112 extracts data at the position corresponding to the bit to which 1 is set, as the data to be compressed.

The accelerator 112 generates a data string by arranging the data to be compressed in a logical address order (Step S203).

Subsequently, the accelerator 112 generates compressed data by applying a compression algorithm to the generated data string (Step S204).

Subsequently, the accelerator 112 stores the compressed data in the memory 113 (Step S205).

Subsequently, the accelerator 112 transmits the completion notification including the storage location (address) of the compressed data on the memory 113 and the data size of the compressed data to the processor 111 (Step S206). Thereafter, the accelerator 112 ends the compression process.

The accelerator 112 can reduce a processing load of the processor 111 by compressing the data string.

FIG. 8 is a flowchart illustrating an example of the reading process of the data string executed by the processor 111 of Embodiment 1.

If the data read request is received from the host 200 or the data predicted based on the tendency of the data read request is read in advance, the storage device 100 initiates a data string reading process.

Here, a reading process is described with reference to a case where the data read request is received. The logical address of the data string in the volume is included in the data read request.

The processor 111 generates an address list of the data that configures the data strings based on logical addresses, sizes of the data strings dealt by the host 200, and deduplication processing units (Step S301). The address list is a list of start addresses (logical addresses) where the data that configures the data strings is stored. At this point, the processor 111 determines the arrangement locations (address ranges) of the data strings on the memory 113. The processor 111 initializes the information relating to the arrangement of the data that configures the decompressed data strings. For example, the processor 111 generates bit strings (bitmaps) in the same number as the number of addresses registered in the address list.

Subsequently, the processor 111 selects a target address from the list (Step S302).

The processor 111 refers to the deduplicated data management information 310 and determines whether the data corresponding to the target address is deleted by deduplication (Step S303).

Specifically, the processor 111 refers to the logical address 311 and searches for the entry where the logical address included in the address range specified by the target address and the size of the data (deduplication processing unit) is set. If there is an entry corresponding to the above condition, the processor 111 determines that the target data is deleted by deduplication.

If it is determined that the data corresponding to the target address is data deleted by deduplication, the processor 111 reads data corresponding to the target address and stores the data in the memory 113 (Step S304). Thereafter, the processor 111 proceeds to Step S306. Specifically, the following processing is executed.

(S304-1) The processor 111 determines the arrangement location (address) of the data corresponding to the target address on the memory 113 based on the size of the data string dealt by the host 200, the logical address of the data string, and the logical address of the target data.

(S304-2) The processor 111 determines whether the data corresponding to the reference logical address 312 of the searched entry in Step S303 is stored in the memory 113.

(S304-3) If the data is stored in the memory 113, the processor 111 copies the corresponding data to the determined arrangement location.

(S304-4) If the data is not stored in the memory 113, the processor 111 refers to the compressed data management information 300, and searches for the entry where the start address of the address range including the searched address is stored in the logical address 301. The processor 111 reads the compressed data from the storage medium 102 and stores the data in the memory 113 based on the address stored in the physical address 302 of the searched entry. The processor 111 transmits the decompression instruction including the storage location (address) of the compressed data on the memory 113 and the arrangement location of the decompressed data string to the accelerator 112. If the completion notification is received from the accelerator 112, the processor 111 copies the data corresponding to the target address which is included in the decompressed data string to the arrangement location.

If the decompression instruction is received, the accelerator 112 decompresses the compressed data and stores the decompressed data string in the designated arrangement location of the memory 113.

The above is the description of the processing of Step S304.

If it is determined that the data corresponding to the target address is not data deleted by deduplication, the processor 111 registers the target address as the data arrangement position (Step S305). Thereafter, the processor 111 proceeds to Step S306.

Specifically, the processor 111 sets 1 to the bit corresponding to the target address of the bitmap.

In Step S306, the processor 111 determines whether the processing with respect to all addresses in the address list is completed (Step S306).

If it is determined that processing with respect to all addresses in the address list is not completed, the processor 111 returns to Step S302 and executes the same processing.

If it is determined that processing with respect to all addresses in the address list is completed, the processor 111 reads the compressed data relating to the data string from the storage medium 102 (Step S307).

Specifically, the processor 111 refers to the compressed data management information 300 and searches for the entry where the address of the address range designated by the read request is stored in the logical address 301. The processor 111 reads the compressed data from the storage medium 102 and stores the data in the memory 113 based on the address stored in the physical address 302 of the searched entry.

Subsequently, the processor 111 transmits the decompression instruction including information indicating the storage location (address) on the memory 113 of the compressed data, the arrangement location (address) of the data string, and the arrangement location of each item of data of the data string, to the accelerator 112 (Step S308). Thereafter, the processor 111 executes the data string reading process.

After receiving the completion notification from the accelerator 112, the processor 111 transmits the data string to the host 200 at any timing.

FIG. 9 is a flowchart illustrating an example of the decompression process executed by the accelerator 112 of Embodiment 1.

When receiving the decompression instruction from the processor 111, the accelerator 112 initiates the decompression process.

The accelerator 112 obtains the compressed data from the memory 113 based on the arrangement location on the memory 113 of the compressed data (Step S401).

Subsequently, the accelerator 112 decompresses the compressed data by applying a decompression algorithm to the compressed data (Step S402).

Subsequently, the accelerator 112 arranges the data included in the decompressed data string in the memory 113 based on the information indicating the arrangement location (address) of the data string and the arrangement location of each item of data of the data string (Step S403).

For example, the information indicating the arrangement location of each data of the data string is the bitmap, the accelerator 112 arranges the data included in the data string at the position corresponding to the bit to which 1 is set. Further, the data is arranged according to the order of the data included in the data string.

Subsequently, the accelerator 112 transmits the completion notification to the processor 111 (Step S404). Thereafter, the accelerator 112 ends the decompression process.

According to Embodiment 1, the storage device 100 reduces the processing load of the processor 111 by executing the compression process and the decompression process together with a data alignment adjustment process, to the accelerator 112. The processing unit of the compression process and the deduplication process can be adjusted to the processing unit appropriate for each process, and thus the data reduction effect can be enhanced.

Embodiment 2

In Embodiment 2, the storage device 100 is different from that of Embodiment 1 in that the plurality of data strings are collectively compressed. Hereinafter, Embodiment 2 is described by mainly describing the differences from Embodiment 1.

First, the overview of processing executed by the storage device 100 of Embodiment 1 is described by using FIGS. 10 and 11. FIGS. 10 and 11 are diagrams describing an overview of the processing executed by the storage device 100 of Embodiment 2.

First, an overview of the writing process executed by the storage device 100 of Embodiment 1 by using FIG. 10 is described. Here, processing when the host 200 writes data strings 1000, 1010, and 1020 to different volumes is described. It is assumed that the size of each of the data strings 1000, 1010, and 1020 is the same.

First, the data strings 1000, 1010, and 1020 written by the host 200 are stored in the memory 113. After the data strings 1000, 1010, and 1020 are stored in the memory 113, the processor 111 executes the deduplication process on each of the data strings 1000, 1010, and 1020. In FIG. 10, the data A is left from the data string 1000, the data B and C is left from the data string 1010, and the data D is left from the data string 1020.

The processor 111 selects data for each compression processing unit from the data strings stored in the memory 113. Here, the size of data of four items is set as a compression processing unit. Accordingly, data A, B, C, and D is selected. The processor 111 transmits the compression instruction of data A, B, C, and D to the accelerator 112.

The accelerator 112 generates the data string ABCD from data A, B, C, and D and generates compressed data abcd by compressing the corresponding data strings. The accelerator 112 stores the compressed data abcd in the memory 113. Thereafter, the processor 111 stores the compressed data abcd on the memory 113 in the storage medium 102. The compressed data is stored in the storage medium 102 without a gap.

If a portion of data of the data string is updated by the host 200, in the method of storing the compressed data of the present embodiment, the original compressed data is not deleted, the compressed data obtained by compressing the data string including the updated data is newly stored in the storage medium 102. Accordingly, the physical addresses associated with the logical addresses are also updated. The data of which the association with the logical address is released is referred to as garbage.

According to the writing of the data string to the volume, a large amount of garbage is generated. Here, the storage device 100 of Embodiment 2 deletes the garbage by executing processing referred to as garbage collection. Further, after the garbage is deleted, the storage device 100 rearranges the compressed data of the storage medium 102. Accordingly, a storage area provided for the volume used by the host 200 in the storage medium 102 is secured.

The above is the overview of the writing process.

Subsequently, an overview of the garbage collection executed by the storage device 100 of Embodiment 1 is described by using FIG. 11. Here, processing when the host 200 writes the data string including the updated data C' corresponding to the data C to the storage device 100 is described. At this point, the data C of the compressed data abcd becomes garbage.

The processor 111 reads the compressed data abcd from the storage medium 102 and stores the data in the memory 113. The processor 111 transmits the decompression instruction to the accelerator 112. The accelerator 112 decompresses the compressed data abcd and stores the data string ABCD in the memory 113.

The processor 111 transmits the compression instruction of the data A, B, and D except data C to the accelerator 112. The accelerator 112 generates a data string ABC from the data A, B, and D and applies the compression algorithm to generate compressed data abd. The accelerator 112 stores the compressed data abd in the memory 113. The processor 111 writes the compressed data abd at the next position of the end position of the storage area where the compressed data of the storage medium 102 is stored.

The above is the overview of the garbage collection. As described above, the accelerator 112 further compresses data obtained by removing garbage from the data string. Since the processor 111 is not required to directly process the data string, the load can be reduced.

The hardware configuration of the storage device 100 of Embodiment 2 is the same as that of Embodiment 1. In Embodiment 2, the management information maintained by the storage device 100 is different.

FIG. 12 is a diagram illustrating an example of compressed data management information 1200 of Embodiment 2.

The compressed data management information 1200 is information for managing the compressed data. The compressed data management information 300 stores an entry configured with a block number 1201, a physical address 1202, and a data size 1203. One entry corresponds to one item of compressed data.

The block number 1201 is a field for storing a block number for identifying compressed data. In Embodiment 2, data of a plurality of data strings is collectively compressed, and thus the logical addresses of the compressed data is not continuous. Accordingly, instead of the logical address, compressed data is identified by using the block number.

The physical address 1202 and the data size 1203 are fields which are the same as the physical address 302 and the data size 303.

FIG. 13 is a diagram indicating an example of host data management information 1300 of Embodiment 2.

The host data management information 1300 is information for managing data deleted from the data string by the deduplication process. The host data management information 1300 stores the entry configured with a logical address 1301, a block number 1302, and an offset 1303. One entry corresponds to one item of data deleted by the deduplication process.

The logical address 1301 is a field which is the same as the logical address 311.

The block number 1302 is a field for storing a block number applied to the compressed data obtained by compressing the data string including the data.

The offset is a field for storing a value indicating a position of the data in the data string before compression.

FIGS. 14A and 14B are flowcharts illustrating examples of the data reduction process executed by the processor 111 of Embodiment 2.

The processor 111 executes the data reduction process at the time of executing the writing process or periodically. The writing process is executed when the storage device 100 receives the data string from the host 200. Here, a case where the data reduction process is executed at the time of executing the writing process is described. Further, in the writing process, the storage device 100 stores the data string in the memory 113 and transmits the completion notification of the writing process to the host 200.

The processor 111 selects the target data string from the data string stored in the memory 113 (Step S501).

The processor 111 divides the data string based on the deduplication processing unit (Step S502).

Subsequently, the processor 111 selects the target data from the divided data (Step S503).

Subsequently, the processor 111 searches for data identical to the target data (Step S504). A method of searching for the data is the same as Step S103.

The data to be compared is data stored in the memory 113 and the storage medium 102.

Subsequently, the processor 111 determines whether there is data identical to the target data based on the search result (Step S505).

If there is data identical to the target data, the processor 111 registers information relating to the target data in the host data management information 1300 (Step S506). Thereafter, the processor 111 proceeds to Step S508.

Specifically, the processor 111 adds the entry to the host data management information 1300 and stores the logical address of the target data in the logical address 1301 of the added entry. The block number of the compressed data included in the searched data and the offset of the corresponding data are stored in the block number 1302 and the offset 1303 of the added entry.

If there is not data identical to the target data, the processor 111 registers the target data as data to be compressed (Step S507). Thereafter, the processor proceeds to Step S508.

Specifically, the processor 111 registers data in which the address of the target data string on the memory 113 is associated with the position (offset) of the data in the target data string in the list.

In Step S508, the processor 111 determines whether processing of all data of the target data string is completed (Step S508).

If it is determined that processing of all data of the target data string is not completed, the processor 111 returns to Step S503 and executes the same processing.

If it is determined that processing of all data of the target data string is completed, the processor 111 determines whether the data amount of the data to be compressed is the threshold value or more (Step S509).

Specifically, the processor 111 calculates the amount of the data to be compressed based on the number of items of the data registered in the list and the deduplication processing unit. The processor 111 determines whether the corresponding data amount is more than the threshold value. Here, the threshold value is the compression processing unit.

If it is determined that the data amount of the data to be compressed is less than the threshold value, the processor 111 returns to Step S501 and executes the same processing.

If it is determined that the data amount of the data to be compressed is the threshold value or more, the processor 111 transmits the compression instruction including the list to the accelerator 112 (Step S510). The processor 111 transitions to the standby state until receiving a completion notification from the accelerator 112. The storage location (address) of the compressed data on the memory 113, the offset of each item of data in the data string before compression, and the data size of the compressed data are included in the completion notification.

If the completion notification is received from the accelerator 112, the processor 111 determines the storage location of the compressed data in the storage medium 102 (Step S511). Specifically, the following processing is executed.

(S511-1) The processor 111 refers to the physical address 1202 of the compressed data management information 1200 and specifies the end position (address) of the storage area where the compressed data of the storage medium 102 is stored. The processor 111 determines the address of the storage area where the compressed data is stored, based on the corresponding address.

(S511-2) The processor 111 adds the entry to the compressed data management information 1200 and stores the block number to the block number 1201. The processor 111 stores the determined address in the physical address 1202 of the added entry. The processor 111 stores the data size of the notified compressed data in the data size 1203 of the corresponding entry.

The above is the description of the processing of Step S511.

Subsequently, the processor 111 updates the host data management information 1300 (Step S512). Thereafter, the processor 111 ends the data reduction process. Specifically, the following processing is executed.

(S512-1) The processor 111 selects the target data from the data to be compressed which is registered in the list.

(S512-2) The processor 111 refers to the host data management information 1300 and searches for the entry corresponding to the target data. Specifically, the processor 111 searches for the entry where the address of the target data is stored in the logical address 1301.

(S512-3) If the processor 111 determines that there is not an entry corresponding to the target data in the host data management information 1300, that is, the target data is data that is first written to the volume, the processor 111 adds an entry to the host data management information 1300. The processor 111 stores the logical address of the target data in the logical address 1301 of the added entry. The processor 111 stores the block number of the compressed data in the block number 1302 of the added entry and stores the offset of the target data in the offset 1303.

(S512-4) If the processor 111 is determined that there is an entry corresponding to the target data in the host data management information 1300, that is, the data is updated, the processor 111 stores the block number of the compressed data in the block number 1302 of the searched entry and stores the offset of the target data in the offset 1303 of the corresponding entry.

(S512-5) The processor 111 determines whether processing of all data to be compressed is completed. If processing of all data to be compressed is not completed, the processor 111 returns to Step S512-1 and executes the same processing. If processing of all data to be compressed is completed, the processor 111 ends the processing of Step S512.

The above is the description of the processing of Step S512. As a result of the processing of Step S512, the block number 1302 and the offset 1303 of the updated data are updated. Accordingly, the physical address in which the association with the logical address is released is referred to as garbage, and the physical address which is not the garbage is referred to be in a valid state. In the garbage collection, the data to be compressed stored in the physical address of the valid state is read and is stored in the storage medium 102 from the front. Accordingly, an unused storage area of the storage medium 102 can be secured.

After the data reduction process is executed, the processor 111 stores the compressed data in the determined address of the storage medium 102 at any timing. For example, the data reduction process and the compressed data storage process may be continuously executed, or the compressed data storage process may be periodically executed. If the compressed data storage process is periodically executed, the processor 111 searches for the compressed data stored in the memory 113 and stores the searched compressed data in the storage medium 102.

FIG. 15 is a flowchart illustrating an example of the compression process executed by the accelerator 112 of Embodiment 2.

If the compression instruction is received from the processor 111, the accelerator 112 initiates the compression process.

The accelerator 112 obtains the data to be compressed from the memory 113 based on the list notified from the processor 111 (Step S601).

The accelerator 112 generates the data string from the data to be compressed (Step S602). At this point, the accelerator 112 generates data that indicates the position (offset) of each item of data to be compressed in the data string.

Subsequently, the accelerator 112 generates the compressed data by applying the compression algorithm to the generated data string (Step S603).

Subsequently, the accelerator 112 stores the compressed data in the memory 113 (Step S604).

Subsequently, the accelerator 112 transmits the storage location (address) of the compressed data on the memory 113, the offset of each item of data in the data string before compression, and the completion notification including the data size of the compressed data to the processor 111 (Step S605). Thereafter, the accelerator 112 ends the compression process.

The accelerator 112 compresses the data string so that the processing load of the processor 111 can be reduced.

The data reading process of Embodiment 2 is the same processing as that in Embodiment 1, and thus the detailed description thereof is omitted.

Subsequently, the garbage collection of Embodiment 2 is described.

FIG. 16 is a flowchart illustrating an example of the garbage collection executed by the processor 111 of Embodiment 2.

The garbage collection may be executed when garbage is generated or may be periodically executed.

The processor 111 selects the target physical address (Step S701). According to the present embodiment, a garbage physical address with a large data amount is selected. This is because the data amount that is stored again is reduced.

For example, if the state transitions from the valid state to garbage, the processor 111 stores the data amount of the compressed data stored in the physical address of which the state transitions to the garbage as the garbage amount. The processor 111 selects the physical address based on the garbage amount.

The processor 111 obtains the compressed data from the storage medium 102 based on the target physical address and stores the data in the memory 113 (Step S702).

The processor 111 transmits the decompression instruction including the address of the compressed data on the memory 113 to the accelerator 112 (Step S703). The processor 111 transitions to the standby state until receiving a completion notification from the accelerator 112. A storage location (address) of the data string of the memory 113 is included in the completion notification.

The processor 111 selects the target data from the data that configures the decompressed data string (Step S704). At this point, the processor 111 generates bit strings (bitmaps) in the same number as the number of items of data included in the decompressed data strings.

The processor 111 determines whether the target data is in the valid state (Step S705). That is, it is determined whether the target data is required to be maintained. It is determined that the target data that is not in the valid state is not required to be maintained.

Specifically, the processor 111 refers to the compressed data management information 1200 and obtains the value of the block number 1201 of the entry corresponding to the target physical address. The processor 111 refers to the host data management information 1300 and searches for the entry where the obtained block number is stored in the block number 1302, and the offset of the target data in the data string is stored in the offset 1303. If there is at least one of the above entries, it is determined that the target data is in the valid state.

If it is determined that the target data is a garbage, the processor 111 proceeds to Step S707.

It is determined that the target data is in the valid state, the processor 111 registers the target data as the data to be compressed (Step S706). Thereafter, the processor 111 proceeds to Step S707.

Specifically, the processor 111 sets 1 to the bit corresponding to the target data of the bitmap.

In Step S707, the processor 111 determines whether processing with respect to all data of the decompressed data string is completed (Step S707).

If it is determined that processing of all data of the decompressed data string is not completed, the processor 111 returns to Step S704 and executes the same processing.

If it is determined that processing of all data of the decompressed data string is completed, the processor 111 transmits the compression instruction including the storage position (address) of the data string on the memory 113 and information relating to the data to be compressed to the accelerator 112 (Step S708). The processor 111 transitions to the standby state until receiving a completion notification from the accelerator 112. The storage location (address) of the compressed data on the memory 113, the offset of each data in the data string before compression, and the data size of the compressed data are included in the completion notification.

If the completion notification is received from the accelerator 112, the processor 111 determines the storage location of the compressed data in the storage medium 102 (Step S709), and then ends the garbage collection. Specifically, the following processing is executed.

(S709-1) The processor 111 adds an entry to the compressed data management information 1200 and stores a block number of the compressed data to the block number 1201 of the added entry. The processor 111 stores the data size of the compressed data in the data size 1203 of the added entry.

(S709-2) The processor 111 refers to the physical address 1202 of the compressed data management information 1200 and specifies the end position (address) of the storage area where the compressed data of the storage medium 102 is stored. The processor 111 determines the address of the storage area where the compressed data is stored based on the corresponding address. The processor 111 stores the determined address to the physical address 1202 of the added entry.

(S709-3) The processor 111 refers to the host data management information 1300 and searches for the entry where the logical address of the data to be compressed is stored in the logical address 1301. The processor 111 stores the block number of the compressed data in the block number 1302 of all searched entry. The processor 111 stores the offset of each item of data in the data string before compression in the offset 1303 of each searched entry.

The above is the description of the processing of Step S709.

If the accelerator 112 executes the compression process and the decompression process as a series of processing, the decompression instruction and the compression instruction may not be sequentially transmitted. That is, the accelerator 112 executes the processing from S601 to S605 after the processing of S401 and S402. In this case, the processor 111 executes processing of S701, S702, and S704 to S707 and then transmits the execution of the processing to the accelerator 112. Accordingly, the same result can be obtained.

The storage device 100 of Embodiment 2 can suppress the processing load of the processor 111 by executing the compression process and the decompression process together with the data alignment adjustment process on the accelerator 112. The processing unit of the compression process and the deduplication process can be adjusted to a processing unit appropriate for each processing, and thus the data reduction effect of the data can be enhanced.

The present invention is not limited to the above embodiments, and various modifications are included. For example, the above embodiments are to specifically describe configurations for better understanding of the present invention, and are not necessarily limited to including all the described configurations. Further, other configurations can be added, deleted, or replaced with respect to a part of the configuration of each embodiment.

A part or all of each of the above configuration, function, processing units, and processing means may be realized by hardware, for example, by being designed with integrated circuits. In addition, the present invention can be realized by program codes of software that realize functions of the embodiments. In this case, a storage medium in which the program code is recorded is provided to the computer, and a processor included in the computer reads the program code stored in the storage medium. In this case, the program code itself read from the storage medium realizes the functions of the above embodiment, and the program code itself and the storage medium storing the program code configure the present invention. Examples of the storage medium that supplies the program code include a flexible disk, a CD-ROM, a DVD-ROM, a hard disk, a Solid State Drive (SSD), an optical disk, a magneto-optical disk, a CD-R, a magnetic stripe, a non-volatile memory card, and a ROM.

Further, the program code that realizes the functions described in the present embodiments can be implemented with a wide range of programs or script languages such as assembler, C/C++, perl, Shell, PHP, Python, and Java (registered trademark).

Further, the program code of the software that realizes the function of the embodiment is transmitted via the network and is stored in storage means of a computer such as a hard disk or memory, or a storage medium such as a CD-RW or a CD-R, so that the processor included in the computer reads and executes the program code stored in the storage means or the storage medium.

In the above embodiment, control lines and information lines required for the description are merely illustrated, and not all the control lines and the information lines on the product are necessarily illustrated. In practice, almost all configurations may be connected to each other.

REFERENCE SIGNS LIST

100: storage device
101: storage controller
102: storage medium
111: processor
112: accelerator
113: memory
114: host interface
200: host
300: compressed data management information
310: deduplicated data management information
1200: compressed data management information
1300: host data management information

The invention claimed is:

1. A storage device comprising:
a processor;
an accelerator;
a memory; and
a storage device including a storage medium,
wherein the memory stores a plurality of continuous items of data,
wherein the processor:
identifies, from among the plurality of continuous items of data, data to be compressed that is data to be stored in the storage medium and data that is not to be compressed that is data to not be stored in the storage medium, and
transmits a compression instruction for the plurality of continuous items of data including information indicating which of the plurality of continuous items of data are to be compressed to the accelerator, and
the accelerator:
reads the plurality of continuous items of data, which includes the data to be compressed and the data that is not to be compressed, from the memory,
combines the data to be compressed by excluding the data that is not to be compressed from the plurality of continuous items of data, based on the compression instruction received from the processor, and
compresses the combined data to generate compressed data to be stored in the storage medium.

2. The storage device according to claim 1, wherein the processor executes a deduplication process on a data string stored in the memory and configured from the plurality of continuous items of data, and the data that is not to be compressed is data that is not to be stored in the storage medium in the deduplication process.

3. The storage device according to claim 2, wherein
the processor identifies the data to be compressed from the data that configures a first data string based on a result of the deduplication process with respect to the first data string, and
generates first position information indicating a position of the data to be compressed in the first data string, as the information relating to the data to be compressed, and
if the compression instruction is received, the accelerator reads the first data string from the memory and obtains the data to be compressed from the first data string based on the first position information.

4. The storage device according to claim 3, wherein
the storage device maintains deduplicated data management information in which data deleted by the deduplication process and a reference destination that is referred to for obtaining the corresponding data are associated, and
the processor:
obtains data that configures a read data string to be a target of a read request based on the deduplicated data management information and that is deleted by the deduplication process, from the reference destination, if the read request is received, and stores the data in the memory,
obtains the compressed data generated from the data that configures the read data string, from the storage medium, and stores the compressed data in the memory, and
transmits a decompression instruction including second position information indicating positions of a plurality of items of data that configure a data string obtained by decompressing the compressed data in each read data string, to the accelerator, and
the accelerator:
generates a second data string by decompressing the obtained compressed data, if the decompression instruction is received, and
stores each of the plurality of items of data that configures the second data string in the memory, so that the read data string is configured based on the second position information.

5. The storage device according to claim 2, wherein
the processor:
identifies each of the data to be compressed of the plurality of data strings based on a result of the deduplication process with respect to the plurality of data strings, and
generates third position information indicating a position of the data to be compressed in each of the plurality of data strings, as the information indicating which of the Plurality of continuous items of data are to be compressed, and
if the compression instruction is received, the accelerator reads the plurality of data strings from the memory and obtains a predetermined number of items of the data to be compressed, from the plurality of data strings based on the third position information.

6. The storage device according to claim 5, wherein
first compressed data generated from a data string configured with first data is stored,
the processor;
reads the first compressed data from the storage medium and stores the first compressed data in the memory, if it is not required to maintain the first data by writing of a new data string, and
transmits a decompression instruction of the first compressed data to the accelerator,
the accelerator generates a third data string by decompressing the first compressed data and stores the third data string in the memory,
the processor transmits a compression instruction including information relating to the first data to the accelerator, and
the accelerator obtains data excluding the first data from data that configures the third data string, and
compresses a fourth data string configured with the obtained data to generate second compressed data.

7. The storage device according to claim 5, wherein
first compressed data generated from a data string configured with first data is stored,
the processor:
reads the first compressed data from the storage medium and stores the first compressed data in the memory, if it is not required to maintain the first data by writing a new data string, and
transmits a re-compression instruction including information relating to the first data to the accelerator, and
the accelerator:
generates a third data string by decompressing the first compressed data and stores the third data string in the memory, if the re-compression instruction is received,
obtains data excluding the first data from data configuring the third data string, and
compresses a fourth data string configured with the obtained data, to generate second compressed data.

8. A data processing method executed by a storage device, wherein
the storage device includes a processor, an accelerator, a memory, and a storage medium,
the data processing method comprising the steps of:
identifying, by the processor, from among the plurality of continuous items of data, data to be compressed that is data to be stored in the storage medium and data that is not to be compressed that is data to not be stored in the storage medium, and
transmitting, by the processor, a compression instruction for the plurality of continuous items of data including information indicating which of the plurality of continuous items of data are to be compressed to the accelerator, and
reading, by the accelerator, the plurality of continuous items of data, which includes the data to be compressed and the data that is not to be compressed, from the memory,
combining, by the accelerator, the data to be compressed by excluding the data that is not to be compressed from the plurality of continuous items of data, based on the compression instruction received from the processor, and
compressing, by the accelerator, the combined data to generate compressed data to be stored in the storage medium.

9. The data processing method according to claim 8, further comprising the steps of:
executing, by the processor, a deduplication process on a data string stored in the memory and configured from the plurality of continuous items of data, wherein the data that is not to be compressed is data that is not to be stored in the storage medium in the deduplication process.

10. The data processing method according to claim 9, wherein the step of identifying includes:

identifying, by the processor, the data to be compressed from the data that configures a first data string based on a result of the deduplication process with respect to the first data string, and generating, by the processor, first position information indicating a position of the data to be compressed in the first data string, as the information relating to the data to be compressed, and the step of reading includes reading, by the accelerator, the first data string from the memory and obtaining the data to be compressed from the first data string based on the first position information.

11. The data processing method according to claim 10, wherein the storage device maintains deduplicated data management information in which data deleted by the deduplication process and a reference destination that is referred to for obtaining the corresponding data are associated, and the data processing method further comprises the steps of:

obtaining, by the processor, data that configures a read data string to be a target of a read request based on the deduplicated data management information and that is deleted by the deduplication process, from the reference destination, if the read request is received, and storing the data in the memory, obtaining, by the processor, the compressed data generated from the data that configures the read data string, from the storage medium, and storing the compressed data in the memory, transmitting, by the processor, a decompression instruction including second position information indicating positions of a plurality of items of data that configure a data string obtained by decompressing the compressed data in each read data string, to the accelerator, generating, by the accelerator, a second data string by decompressing the obtained compressed data, and storing, by the accelerator, each of the plurality of items of data that configures the second data string in the memory based on the second position information, so that the read data string is configured.

12. The data processing method according to claim 9, wherein the step of identifying includes:

identifying, by the processor, each of the data to be compressed of the plurality of data strings based on a result of the deduplication process with respect to the plurality of data strings, and generating, by the processor, third position information indicating a position of the data to be compressed in each of the plurality of data strings, as the information indicating which of the plurality of continuous items of data are to be compressed, and the step of reading includes reading, by the accelerator, the plurality of data strings from the memory and obtaining a predetermined number of items of the data to be compressed, from the plurality of data strings based on the third position information.

13. The data processing method according to claim 12, wherein the storage device stores first compressed data generated from a data string configured with first data, the data processing method further comprises the steps of:

reading, by the processor, the first compressed data from the storage medium and storing the first compressed data in the memory, if it is not required to maintain the first data by writing of a new data string, transmitting, by the processor, a decompression instruction of the first compressed data to the accelerator, generating, by the accelerator, a third data string by decompressing the first compressed data and storing the third data string in the memory, transmitting, by the processor, a compression instruction including information relating to the first data to the accelerator, and obtaining, by the accelerator, data excluding the first data from data that configures the third data string, and compressing a fourth data string configured with the obtained data to generate second compressed data.

14. The data processing method according to claim 12, wherein the storage device stores first compressed data generated from a data string configured with first data, the data processing method further comprises the steps of:

reading, by the processor, the first compressed data from the storage medium and storing the first compressed data in the memory, if it is not required to maintain the first data by writing a new data string, transmitting, by the processor, a re-compression instruction including information relating to the first data to the accelerator, generating, by the accelerator, a third data string by decompressing the first compressed data and storing the third data string in the memory, if the re-compression instruction is received, and obtaining, by the accelerator, data excluding the first data from data configuring the third data string and compressing a fourth data string configured with the obtained data, to generate second compressed data.

* * * * *